United States Patent [19]

Bladon et al.

[11] Patent Number: 5,374,346
[45] Date of Patent: Dec. 20, 1994

[54] ELECTROPLATING PROCESS AND COMPOSITION

[75] Inventors: John J. Bladon, Wayland; Carl Colangelo, New Bedford; John Robinson, Ayer; Michael Rousseau, Woburn, all of Mass.

[73] Assignee: Rohm and Haas Company, Philadelphia, Pa.

[21] Appl. No.: 104,801

[22] Filed: Aug. 9, 1993

[51] Int. Cl.$^5$ .......................... C25D 5/34; C25D 5/54
[52] U.S. Cl. ...................................... 205/125; 205/210; 205/159; 427/97; 427/307; 427/424; 156/666
[58] Field of Search ............... 205/123, 124, 125, 210, 205/920, 159; 427/421, 424, 427, 96, 97, 307; 156/666

[56] References Cited

U.S. PATENT DOCUMENTS 5,007,968  4/1991  Cobbman et al. ............... 156/666
5,207,888  5/1993  Bladon ............................ 205/125

Primary Examiner—John Niebling
Assistant Examiner—Edna Wong
Attorney, Agent, or Firm—Robert L. Goldberg

[57] ABSTRACT

A process of electroplating comprising formation of a semiconductive coating over an article having both metallic and non-metallic portions, dissolving the metal surface underlying the semiconductive coating and removing the semiconductive coating by a high pressure water spray. The process is useful for the formation of printed circuit boards.

25 Claims, 1 Drawing Sheet

ELECTROPLATING PROCESS AND COMPOSITION

BACKGROUND OF THE INVENTION

I. Introduction

This invention relates to electroplating nonconductors, and more particularly, to processes for electroplating the surface of a nonconductor having a semiconductive coating over its surface. The invention is especially useful in the manufacture of printed circuit boards by a process involving passage of the boards through an apparatus, preferably in a horizontal mode.

II. Description of the Prior Art

Nonconducting surfaces are conventionally metallized by a sequence of steps comprising catalysis of the surface of a nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of a metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin-noble or precious (catalytic) metal colloid.

Electroless plating solutions are aqueous solutions containing both a dissolved metal and a reducing agent in solution. The presence of the dissolved metal and reducing agent together in solution results in plate-out of metal in contact with a catalytic metal tin catalyst. However, the presence of the dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a direct plating process whereby a metal is deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is essentially the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is said to be described in U.K. Patent No. 2,123,036 B, incorporated herein by reference. In accordance with the process described in this patent, a surface is provided with metallic sites and the surface is then electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface.

One commercial application of the process of the U.K. patent is the metallization of the walls of through-holes in the manufacture of double-sided printed circuit boards by a process known in the art as panel plating. In this application, the starting material is a printed circuit board substrate clad on both of its surfaces with copper. Holes are drilled through the printed circuit substrate at desired locations. To provide conductivity, the hole walls are catalyzed with a tin-palladium colloid to form the required metal sites on the walls of the through-holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the cross section of the substrate, during electroplating, deposition initiates at the interfaces of the copper cladding and the through-hole walls and rapidly propagates into the holes. The hole wall is plated to a desired thickness within a reasonable period of time. Thereafter, the circuit board is finished by imaging and etching operations.

A disadvantage to the above panel plating process is that copper is electroplated over the hole walls and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, expensive.

The art, recognizing the disadvantage of panel plating, has developed a method for manufacturing printed circuit boards known as pattern plating. In this process, a printed circuit board base material is drilled at desired locations to form through-holes. Through holes are metallized using conventional electroless plating techniques. Electroless copper is plated onto the walls of the through-holes and over the copper cladding. Thereafter, photoresists are applied and imaged to form the circuit pattern. The board is then electroplated with copper depositing on the copper conductors and through-hole walls, but not over the entire surface of the copper cladding. Soldermask is then plated over the exposed copper by immersion or by electroplating and the remaining photoresist is stripped from the surface. The copper not protected by the solder is then removed by etching to form the copper circuit.

Pattern plating cannot be used with the metallizing process of the aforesaid U.K. patent. The treatment of the copper cladding prior to the application of the photoresist and the development of the photoresist, all as required for pattern plating, requires the use of treatment chemicals found to dissolve or desorb the tin-palladium colloid from the hole walls. Since this occurs prior to electroplating, direct electroplating to provide conductor through-holes becomes impossible.

Further improvements in the processes for the direct electroplating of nonconductors are disclosed in U.S. Pat. Nos. 4,895,739; 4,919,768 and 4,952,286, all incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalytic surface to a chalcogenide surface. By conversion of the surface to the chalcogen conversion coating, the electroless plating catalyst does not desorb from the surface during metallization, and consequently, in accordance with the processes of said patents, it is possible to pattern plate substrates in the formation of printed circuit boards.

The processes of the aforementioned patents provide a substantial improvement over the process of the U.K. Patent. However, it has also been found that treatment of an absorbed catalytic metal over a nonconductor with a solution of a chalcogenide, especially a sulfide solution, results in a formation of a chalcogenide on all metal surfaces in contact with the solution of the chalcogen. Therefore, if the process is used in the manufacture of printed circuit boards, the copper cladding or conductors of the printed circuit board base material are converted to the chalcogenide together with the catalytic metal. If the chalcogenide of the copper is not removed prior to plating, it can reduce the bond strength between the copper and a subsequently deposited metal over the copper.

An alternative direct plate process is disclosed in U.S. Pat. No. 5,108,786 incorporated herein by reference. In accordance with the process of this patent, the surface of a substrate is pretreated with an electroless plating catalyst of the type described above and then, following acceleration, treated with a reducing solution such as a solution of a borohydride or an amine borane. Treatment with the solution of the reducing agent is said to improve the resistance of the so formed semiconductive coating to subsequent treatment chemicals. In practice, it has been found that treatment with the solution of the reducing agent results in deposit formation on the copper cladding of circuit board materials which interferes with copper-to-copper bond strength.

An additional alternative direct plate process is disclosed in U.S. Pat. No. 5,071,517. Again, an electroless plating catalyst is adsorbed onto the surface of a part to be plated. In accordance with the process of this invention, the catalyst used is modified by the introduction of an aromatic aldehyde into the catalyst formulation during its make-up. The aromatic aldehyde is said to increase the chemical resistance of the semiconductive layer. Though not disclosed in the patent, but practiced in commerce, the next step in the process involves treatment with an accelerator to which a soluble copper salt is added. The soluble copper salt is said to increase the rate of deposition from an electroplating solution. It has been found in practice that the use of this accelerator also results in formation of a coating on the copper cladding on circuit board materials.

In the manufacture of printed circuit boards by either conventional electroless procedures, or by direct plate procedures, it was the practice of the industry to use vertical processing techniques. Vertical processing comprises conveyorizing the circuit boards in a horizontal path and vertically lowering the boards into treatment tanks for chemical processing. More recently, the industry has moved from vertical processing to horizontal processing techniques as such horizontal processing techniques provide advantages over vertical processing. These advantages include reduced manual handling due to an ability for continuous production flow from one process step to another; simpler mechanics and easier automation procedures; an ability to process boards of differing sizes and thickness; individual processing of boards with more consistent results; vertical orientation of through-holes permitting easier cleaning; reduced immersion time due to forced flood and suction resulting in efficient through-hole solution flows; processing in an enclosed environment reducing operator exposure to chemical fumes and solutions; and the use of pinch rollers to reduce drag out of processing solutions. Though the advantages of horizontal processing were known, difficulty was encountered in attempting to apply horizontal techniques to direct plate processes.

SUMMARY OF THE INVENTION

The present invention provides an improved processing sequence whereby either horizontal or vertical processing techniques may be used for direct plate procedures. The improvement is predicated upon the use of a high pressure spray rinsing process of treated substrates to remove undesired coatings from copper cladding prior to plating. The high pressure spray is preferably preceded by an etching step that penetrates and undercuts the coating over the copper rendering it more readily removed by the high pressure spray. The term high pressure spray as used herein is defined as a spray at a pressure of at least about 100 pounds per square inch (psi).

DESCRIPTION OF THE PREFERRED EMBODIMENTS

Figure 1:
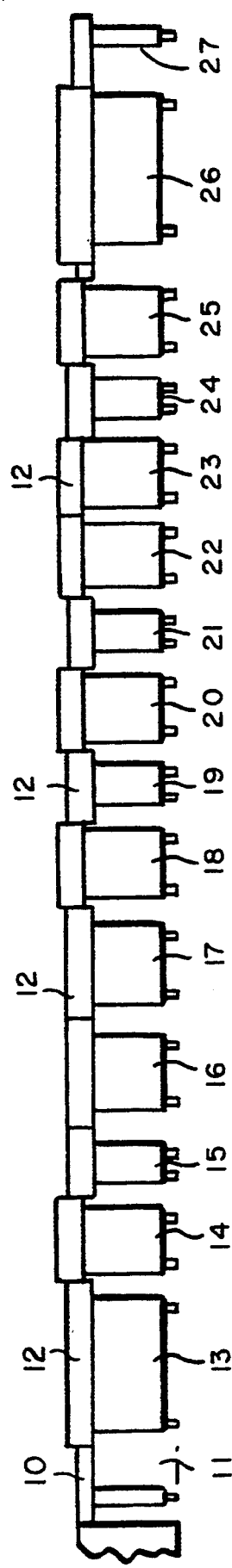
FIG. 1 of the drawings represents a horizontal processing sequence in accordance with a preferred embodiment of the invention.

A preferred procedure in accordance with the invention comprises a sequence using sulfide treatment of a palladium-tin colloid to form a conversion coating suitable for direct electroplating. Accordingly, the description that follows illustrates the invention using the formation of a sulfide conversion coating for direct plate. It should be understood however, that the invention is suitable for any direct plate process where residues are formed on metallic substrates prior to plating.

The use of sulfides to form the conversion coating is disclosed in U.S. Pat. Nos. 4,895,739; 4,919,768 and 4,952,286 cited above. In a preferred embodiment, the processing sequence typically comprises treatment of the substrate with the following materials:

| Step | Purpose |
|---|---|
| sensitizer; | increase adsorptivity of substrate to subsequently applied electroless plating catalyst (activator) by imparting an opposite charge to the catalyst on the substrate; |
| water rinse; | |
| preactivator; | maintain pH and chloride content of activator constant and prevent drag-in of contaminants to activator; |
| activator; | provides an electroless tin palladium plating catalyst on the substrate surface; |
| water rinse; | |
| converter; | removes excess stannous tin from catalyzed substrate to be plated; |
| water rinse; | |
| enhancer; | converts palladium oxides to palladium sulfides which are insoluble in subsequent treatment compositions; |
| stabilizer; | converts remaining stannous compounds to tin oxides; and |
| water rinse; | |
| micro etcher; | removes tin oxides and sulfides formed on copper and provides clean copper surface for plating. |

Following the above procedure, the part is further processed by a sequence that involves electroplating metal over the part having a sulfide conversion coating formed by the above process.

The above treatment sequence is typically applied to a copper clad epoxy substrate filled with glass fibers. As is known in the art, the epoxy can be substituted or mixed with other resins for specific purposes. When the process is used for the manufacture of double-sided printed circuit boards, a first step comprises formation of through-holes by drilling or punching or any other method known to the art. Following formation of the holes, it is desirable to employ a conventional step of desmearing the holes by sulfuric acid, chromic acid, plasma etching or etchback with chromic acid or permanganate followed by glass etching. Thereafter, the above processing sequence is used. The processing sequence and chemicals used to conduct the processing sequence are known in the art. The sensitizer is usually a surfactant that alters the charge on the surface to be plated. Preferred sensitizers are those that impart a positive charge to the substrate, typically polyelectrolytes. The most preferred solutions are aqueous solutions of polymeric polyamines. Suitable examples of sensitizers can be found in U.S. Pat. Nos. 4,478,883 and 4,634,619 and U.K. Patent Specification No. 1 338 491, all incorporated herein by reference.

Where the preactivator serves the purpose of preventing contamination of the activator solution, it typically has a composition similar to the activator solution without the catalytic metal. Consequently, the preactivator solution is typically an aqueous acid solution of halide ions and stannous tin. Conventional activator solutions comprise the product resulting from the reduction of a catalytic metal such as palladium by stannous tin in acidic solution. Suitable activator solutions are disclosed in U.S. Pat. Nos. 3,011,920 and 3,874,882, both incorporated herein by reference.

The converter is typically a mild acid solution suitable for dissolving excess stannous ions. Suitable converters are disclosed in the aforesaid U.S. Pat. Nos. 3,011,920 and 3,874,882 but are identified as accelerators.

The enhancer is typically an aqueous solution of a water soluble sulfide, preferably an alkaline earth metal sulfide salt such as sodium, potassium and lithium sulfide. The concentration of the sulfide in solution can range from about 0.001 to 15 g/l of solution but preferably is within the lower limit of that range. Examples of suitable enhancers are disclosed in the aforesaid U.S. Pat. Nos. 4,895,739; 4,919,768; and 4,952,286. The stabilizer converts tin sulfide to acid soluble tin oxide. Suitable stabilizers include strong alkaline solutions such as sodium or potassium hydroxide solutions. Preferably, the stabilizer is used as an aqueous solution containing from about 0.1 to 50 grams per liter of solution with aeration.

The final step in the process comprises removal of tin oxides and sulfides from copper surfaces using a microetch solution. A typical microetch solution may comprise a sulfuric acid-hydrogen peroxide solution such as that disclosed in the aforesaid U.S. Pat. No. 5,017,742.

A horizontal processing line incorporating the procedure of the invention is depicted in FIG. 1 of the drawings. The process is operated by an operator at control station 10. The control station is used to control the passage of the circuit panels through the horizontal system. Such parameters as solution temperatures and composition and conveyor speed are controlled from the control panel 10. The horizontal processing equipment illustrated in the drawing is modular, thus facilitating alteration to the line by introduction of additional steps in the sequence or removal or replacement of a defective module requiring repair.

The circuit panels are fed into the horizontal equipment at feed station 11. This may be accomplished manually or may be automated if desired. The panels are fed onto a conveyor which carries each circuit panel through the entire length of the horizontal line. The design of the conveyor is in accordance with known techniques and a horizontal roller conveyor is satisfactory. Preferably, conveyor rollers comprise a rigid roller core having a pliable and/or elastic coating of a rubber-like material disposed on their outer surfaces.

The first station within the horizontal line is sensitizer tank 13. The circuit panel passes through tank 13 beneath the surface of the sensitizer whereby both sides of the panel are contacted with the sensitizer solution. Moreover, tank 13, and all other tanks containing treatment solution in the line are provided with pump and suction means (not shown in the drawings) whereby liquid is forced through the through-holes in the circuit panel to ensure contact of the hole-walls with treatment solution. The optimum immersion time in the sensitizer tank 13 is about 1 minute. The panel passes from sensitizer tank to rinse tank 14 whereby the boards are spray rinsed at conventional spray pressures, about 10 to 25 lbs/sq. in.

Following the steps of treatment with the sensitizer and rinsing, the circuit panels are conveyed into preactivator tank 15 and then into two activator tanks 16 and 17 in series. A step of rinsing is not necessary and not desired between the preactivator tank 15 and the activator tank 16 as the acidity of the preactivator solution helps maintain the acidity of the activator. In all three tanks, the circuit panels are conveyed beneath the surface of the treatment solution. Immersion time in preactivator tank 15 is relatively short—i.e., about 15 seconds, and hence, the path through tank 15 is correspondingly short. The immersion time in the activator is relatively long—i.e., about 2 to 2½ minutes. Therefore, a relatively long path is required through the activator. For convenience, two activator tanks 16 and 17 are illustrated to provide a sufficiently long path for the circuit panels. However, it should be recognized that one relatively long treatment tank can be used in place of the two tanks illustrated. Following passage through the activator tank 16 and 17, the circuit panels pass through a spray rinse in spray tank 18.

The next step in the process comprises treatment with converter solution in treatment tank 19. Contact with the converter is of relatively short duration, 15 to 30 seconds being adequate, and a relatively short path through tank 19 is adequate. The circuit panel passes through tank 19 and into spray rinse tank 20 for removal of residual chemicals on the circuit panels. At this point in the process, the substrate has all of its surfaces, inclusive of copper cladding and through-hole walls, coated with absorbed plating catalyst—e.g., absorbed palladium hydrous oxide colloids.

To make the substrate sufficiently conductive for a direct plate operation, the nonconductive colloid of the palladium hydrous oxide is converted to a semiconductive palladium sulfide. This takes place in enhancer tank 21 where the circuit panel is passed beneath the surface and through a solution of a divalent sulfur compound to convert the palladium oxide to palladium sulfide. The required time in the enhancer solution is short and a period of about 15 seconds is adequate.

Prior to contact of the circuit panel with the enhancer, the colloidal plating catalyst absorbed on the surface of the circuit panel contains various tin compounds as well as palladium hydrous oxides. Treatment with the enhancer converts the tin compounds to tin oxides and tin sulfides. These materials are not conductive and it is desirable to remove them from the panel prior to plating. This is accomplished by passing the circuit panels into treatment tank 22 containing a stabilizer solution which is believed to convert insoluble tin sulfide compounds to soluble tin oxide solutions. The treatment solution in stabilizer tank 22 is preferably applied by spraying at conventional spray pressures. Treatment time with the stabilizer is preferably about 15 seconds. Following treatment with the stabilizer, the part is passed through another spray rinse cycle and spray tank 23.

The circuit panels treated in accordance with the invention are typically clad with copper. When the copper cladding of the panels is contacted with the enhancer in tank 21, copper sulfide is formed on the top surface of the copper cladding. Copper sulfide, if not removed, will interfere with the bond strength between the copper cladding and a subsequently deposited copper electroplate. Consequently, the copper sulfide must be removed prior to electroplating copper onto the panel surfaces. This is accomplished by passing the circuit panels beneath the surface of the microetch solution in treatment tank 24. An etchant formulated to dissolve copper sulfide from the copper surface would also dissolve palladium sulfide. This would destroy the conductivity of the layer over the dielectric surface. Therefore, the microetch used is one that penetrates the porous copper sulfide layer and dissolves the underlying copper cladding. This decreases the bond between the copper sulfide and the copper cladding facilitating the removal of the copper sulfide. However, it has been unexpectedly found that the microetch by itself is incapable of removing the sulfide from the copper cladding.

Figure 2:
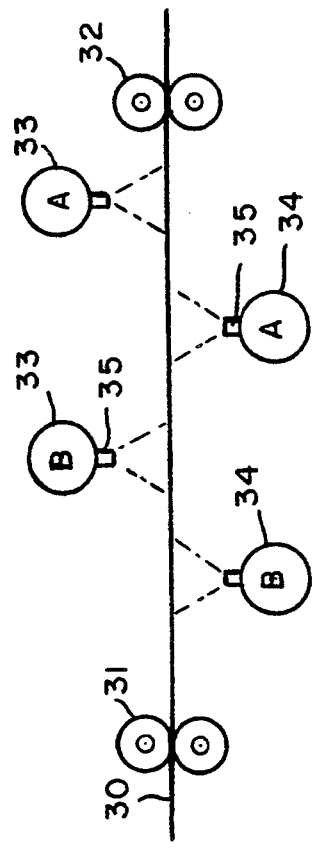
FIG. 2 of the drawings represents a spray nozzle configuration in accordance with a preferred embodiment of the invention.

Following the step of microetching, notwithstanding that the sulfide residue on the copper surfaces had been undercut by dissolution of the copper cladding in the microetch step, the residue still adheres to the underlying copper and has to be removed prior to electroplating. Mechanical scrubbing has been attempted, but it was found that some residue remained and following electroplating, defects were found at the top surface of the through-holes in proximity to the copper cladding-the hole hip. In accordance with the invention, the circuit panel is passed from the microetch tank 24 to high pressure spray chamber 25 without permitting the panel to dry. Within the high pressure spray chamber, the circuit panel is preferably sprayed both from beneath and above the panel as it transverses the spray chamber. The preferred method of spraying the panels uses staggered spray bars with each spray bar perpendicularly transversing the path of the circuit panel. The spray bars should be staggered such that the first spray bar is above the circuit panel, the next along the path of the circuit panel is beneath the circuit panel, the next above, etc. This is illustrated in FIG. 2 of the drawings where there is shown a circuit panel 30 passing through the spray chamber. The panel is conveyed through the chamber by entrance rollers 31 and exit rollers 32. Spray bars 33 are placed above circuit panel 30 and spray bars 34 are placed beneath the panel. Each spray bar is provided with a series of spray heads 35 spaced along each spray bar. It is preferred that the spray heads 35 on each spray bar be offset or staggered from spray bar to spray bar so that the spray heads are not aligned along the path of travel of the circuit panel. For example, the spray heads on the second spray bar may be offset from the spray heads on the first spray bar by one-half of the distance between spray heads.

Spray conditions are critical. Nozzle pressure of the spray required to adequately clean copper surfaces should exceed 100 psi, preferably should exceed 150 psi but should not exceed that pressure that would damage the substrate. For circuit board substrates having through holes, spray pressure should exceed that pressure defined by the following equation $$X = \frac{0.24T^2}{D} - Y$$

where X is spray pressure in psi, T is the thickness of the circuit board substrate in mils, D is the diameter of the smallest through-holes in the board in mils and Y is 50 and in a preferred embodiment, 100, provided that the spray pressure is not less than the minimum spray pressure of at least 100 psi. Maximum spray pressure should not exceed the value set forth in the following equation:

$$X = \frac{0.24T^2}{D} + Y$$

where X, T and D are as defined above and Y is 100 and preferably 200.

The tip of the nozzle of the spray head should be placed at a distance not exceeding 6 inches from the board surface, preferably not exceeding 3 inches, and most preferably not exceeding 2 inches. Conveyor speed of the boards under the nozzles is dependent upon the number of spray bars. A greater number of spray bars permits a higher conveyor speed. For a system having two spray bars above and below the board, the speed of the board should be less than 10 feet per minute and preferably should vary between 1 and 5 feet per minute. The distance between spray bars (upper and lower bars) should not exceed 12 inches and preferably should not exceed 6 inches. The spray impingement angle on the board should be about 90°. The spray nozzles used should be fan or cone type nozzles with a fan angle not exceeding 30° and preferably not exceeding 20°. The spray heads should be arranged such that the spray from each spray head covers some of the same board area as its adjacent spray head in order to ensure complete coverage of all holes on the boards. The spray heads should be rotated somewhat to avoid impingement. The temperature of the spray should not be less than 60° F.

Following high pressure spray, the circuit panel is passed to a dryer 26 where the board is dried at elevated temperature, typically in excess of 120° F. and passed to inspection chamber 27. Thereafter, the boards may be stored or electroplated in conventional manner.

The following example illustrates the process of the invention.

EXAMPLE

A prepreg was constructed having a layer of 1 oz. copper foil, two sheets of prepreg 1080 having a resin content of approximately 65%, 1 oz. double-sided copper clad innerlayer, 6 sheets of prepreg 1080, a second layer of 1 oz. double-sided copper clad innerlayer, two additional sheets of prepreg 1080, and a final layer of 1 oz. copper foil. The thickness of the 1 oz. copper foil was 0.0014 inches, the thickness of the prepreg 1080 layers was 0.0030 inches, and the thickness of the 1 oz. double-sided copper clad innerlayer was 0.0310 inches to provide a finished panel having a total thickness of 0.0948 inches. The panel had a width of 18 inches and a length of 24 inches.

The panel was provided with a symmetrical pattern of through-holes. Four different size through-holes were used. The dimensions were 0.012 inches, 0.018 inches, 0.024 ml and 0.036 ml. For each hole size, 2,016 holes were formed.

Apparatus of the type illustrated in FIG. 1 of the drawings was used. The nozzles used were 15° fan-type nozzles containing a 1/16" orifice (Bete Fog Nozzle, Model No. NF0515). Two spray bars in front of and two spray bars behind the board containing a total of 26 nozzles (13 in each set, one row of 6 and a second row of 7) were utilized. The pressure used was 200 psi. The nozzle was displaced 2.5" from the board. The speed through the array of nozzles was 4" per minute and the spray fan angle was 15°.

Forty-two holes from each set of holes were cross-sectioned and analyzed for film at the interface between the plated copper and copper innerlayers. Analysis showed no film on any of the innerlayers.

We claim:

1. A process for preparing an article for electroplating, said process comprising the steps of providing an article having metallic surfaces and surfaces that are electrically nonconductive; coating surfaces of said article with a non-metallic, semiconductive, liquid permeable layer; contacting said article with an etchant capable of dissolving said metallic surfaces without removing said semiconductive layer for a time sufficient to dissolve at least the top layer of said metallic surfaces; and contacting said article with an aqueous spray at a spray pressure of at least 100 pounds per square inch.

2. The process of claim 1 where the spray pressure is at least 180 pounds per square inch.

3. The process of claim 1 where the spray impinges on the article at an angle of about 90°.

4. The process of claim 1 where the article is a flat panel.

5. The process of claim 4 where the article passes through the spray on a horizontal plane.

6. The process of claim 5 where the article is sprayed above and below the panel.

7. The process of claim 4 where the flat panel has holes passing through the panel from one surface to the other and said holes are coated with said semiconductive coating.

8. The process of claim 4 where the article is sprayed from spray bars having multiple spray nozzles disposed above and below the panel.

9. The process of claim 8 where the spray nozzle is a fan or conical spray nozzle.

10. The process of claim 9 where the spray nozzle is a fan nozzle with a fan angle not exceeding 30°.

11. A process for formation of a primed circuit board, said process comprising the steps of providing a copper clad printed circuit board base material having an array of holes therein; coating surfaces of said circuit board base material with a non-metallic, semiconductive, liquid permeable layer; contacting said circuit board base material with an etchant capable of dissolving copper without dissolving said semiconductive layer for a time sufficient to dissolve at least the top layer of said copper surface; contacting said circuit board base material with an aqueous spray at a spray pressure of at least 100 pounds per square inch to remove said semiconductive layer from all copper surfaces; and electroplating said circuit board base material.

12. The process of claim 11 where said circuit board base material is conveyed through the etchant and the liquid spray on a horizontal plane.

13. The process of claim 11 where said semiconductive layer is a sulfide.

14. The process of claim 13 where the sulfide is a metallic sulfide.

15. The process of claim 14 where the sulfide is palladium sulfide.

16. The process of claim 11 where the minimum pressure is at least 180 pounds per square inch at the surface of the board.

17. The process of claim 16 where the minimum spray pressure is defined by the following equation:

$$X = \frac{0.24T^2}{D} - Y$$

where X is spray pressure in psi, T is the thickness of the circuit board substrate in mils, D is the diameter of the smallest through-holes in the board in mils and Y is 50.

18. The process of claim 17 where Y is 100.

19. The process of claim 11 where the spray impinges on the circuit board base material at an angle of 90°.

20. The process of claim 11 where the circuit board base material is sprayed above and below the panel from fan or conical spray nozzles having a fan angle not exceeding 30°.

21. The process of claim 20 where the angle does not exceed 20°.

22. The process of claim 18 where the circuit board base material is sprayed from spray bars having multiple spray heads disposed above and below the panel.

23. The process of claim 22 where the spray bars above and below the panel are staggered whereby the through-holes within the circuit board base material are not simultaneously contacted by the spray from above and below the panel.

24. The process of claim 22 where the spray bar above the circuit board base material is separated from the spray bar beneath the circuit board base material by a distance of at least two inches in a horizontal path in which the circuit board base material is moving.

25. The process of claim 21 where the spray nozzles are no greater than two inches from the circuit board base material.

* * * * *